United States Patent [19]

Takahashi et al.

[11] Patent Number: 5,625,296
[45] Date of Patent: Apr. 29, 1997

[54] ELECTRO-OPTIC VOLTAGE MEASUREMENT APPARATUS

[75] Inventors: Hironori Takahashi; Yutaka Tsuchiya, both of Hamamatsu; Takeshi Kamiya, Suginami-ku, all of Japan

[73] Assignee: Hamamatsu Photonics K.K., Hamamatsu, Japan

[21] Appl. No.: 597,226

[22] Filed: Feb. 6, 1996

[30] Foreign Application Priority Data

Feb. 7, 1995 [JP] Japan .................................. 7-019252

[51] Int. Cl.$^6$ .......................... G01R 31/308; G01R 31/02
[52] U.S. Cl. ................................. 324/753; 324/96
[58] Field of Search ............................. 324/753, 752, 324/76.36, 96; 359/245, 246, 249, 251, 257

[56] References Cited

U.S. PATENT DOCUMENTS

| | | | |
|---|---|---|---|
| 4,446,425 | 5/1984 | Valdmanis et al. | 324/96 |
| 4,618,819 | 10/1986 | Mourou et al. | 324/96 |
| 5,057,771 | 10/1991 | Pepper | 324/96 |
| 5,412,330 | 5/1995 | Ravel et al. | 324/753 |
| 5,546,011 | 8/1996 | Takahashi et al. | 324/753 |

FOREIGN PATENT DOCUMENTS

| | | |
|---|---|---|
| 1-121764 | 5/1989 | Japan . |
| 4-158281 | 6/1992 | Japan . |

OTHER PUBLICATIONS

Takahashi et al, "Noise Suppresion by a Novel probe Beam Polarization Modulation in Electro–Optic Sampling", Appl. Phys. Lett., vol. 58, No. 20, May 20, 1991, pp. 2200–2202.

Kolner, "Electrooptic Sampling in GaAs Integrated Circuits", IEEE Journal of Quantum Electronics, vol. QE–22, No. 1, Jan. 1986, pp. 79–93.

Valdmanis et al, "Subpicosecond Electrooptic Sampling: Principles and Applications", IEEE Journal of Quantum Electronics, vol. QE–22, No. 1, Jan. 1986, pp. 69–78.

*Primary Examiner*—Ernest F. Karlsen
*Attorney, Agent, or Firm*—Cushman Darby & Cushman, IP Group of Pillsbury Madison & Sutro, LLP

[57] ABSTRACT

A processing unit notifies a drive unit of a designated number N (=1, 2, . . . ). The drive unit supplies a drive signal of a frequency $f_0$ to a target measurement device, and supplies a modulation signal of a frequency $N \cdot f_0 + \Delta f$ to an optical modulator. In this state, a continuous emission light beam is emitted from a light source, incident on an E-O probe sequentially through a polarizer and a first optical system, influenced by a periodical voltage waveform generated at a target measurement portion at a fundamental period $1/f_0$ to modulate the polarized state, and output from the E-O probe. The optical signal whose polarized state is modulated is input to the optical modulator and modulated. Thereafter, a polarization direction is selected by an optical selection unit, and the optical signal is input to an photodetector 510 and heterodyne-detected. The processing unit reproduces the waveform of the voltage signal generated at the target measurement portion by calculation of Fourier transform on the basis of the obtained photodetection signal and displays the waveform.

8 Claims, 9 Drawing Sheets

Fig. 2A

VOLTAGE SIGNAL AT TARGET
MEASUREMENT PORTION
(TIME WAVEFORM)

Fig. 2B

VOLTAGE SIGNAL AT TARGET
MEASUREMENT PORTION
(FREQUENCY DISTRIBUTION)

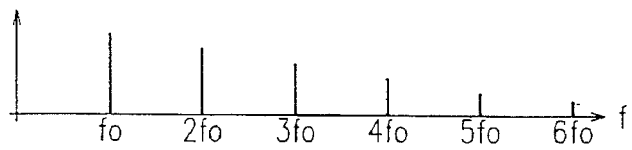

Fig. 2C  [N = 1]

MODULATED SIGNAL TO
MODULATOR 410

Fig. 2D

PHOTODETECTION SIGNAL
FROM PHOTODETECTOR 510

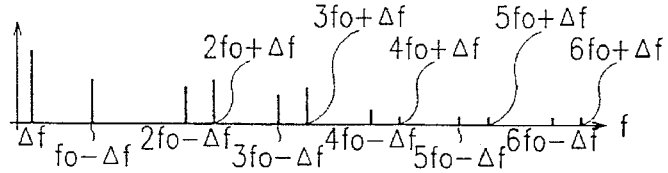

Fig. 2E

SIGNAL PASSING THROUGH
FILTER 521

Fig. 2F  [N = 2]

MODULATED SIGNAL TO
MODULATOR 410

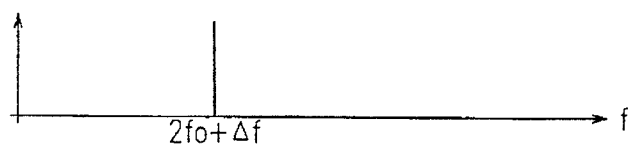

Fig. 2G

PHOTODETECTION SIGNAL
FROM PHOTODETECTOR 510

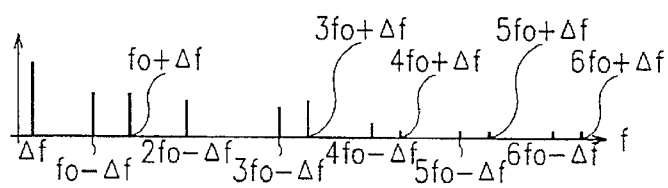

Fig. 2H

SIGNAL PASSING THROUGH
FILTER 521

VOLTAGE SIGNAL AT
TARGET MEASUREMENT
PORTION

PULSE LIGHT BEAM
EMITTED FROM PULSE
LIGHT SOURCE 830

LIGHT INPUT TO
PHOTODETECTOR 851

OUTPUT FROM
PHOTODETECTOR 851

5,625,296

ELECTRO-OPTIC VOLTAGE MEASUREMENT APPARATUS

BACKGROUND OF THE INVENTION

1. Field of the invention

The present invention relates to an electro-optic voltage measurement apparatus for measuring a voltage of a sample to be measured.

2. Related Background Art

As a measurement device for detecting the operative state of a sample to be measured (target measurement object) such as an integrated circuit, voltage measurement apparatuses which have electro-optic conversion probes (E-O probes) consisting of an electro-optic material having an electro-optic effect and do not adversely affect the operation of the integrated circuit, e.g., do not cause an electrical short circuit during measurement have received a great deal of attention. As such conventional voltage measurement apparatuses having E-O probes, there are apparatuses using a pulse light beam having a short pulse width as a probe light beam.

SUMMARY OF THE INVENTION

FIG. 6 is a block diagram showing the arrangement of an apparatus (to be referred to as the 1st comparative apparatus hereinafter). As shown in FIG. 6, the 1st comparative apparatus comprises (a) a drive unit 810 for operating a device (sample to be measured) 890 at a frequency $f_0$ (=100 MHz), (b) a pulse source drive unit 820 for receiving a signal of the frequency $f_0$ output from the drive unit 810 as a trigger signal to generate a pulse source drive signal of a frequency $f_0+\Delta f$ ($\Delta f=10$ Hz), (c) a pulse light source 830 for receiving the pulse source drive signal output from the pulse source drive unit 820 to generate a pulse light beam, (d) a polarization beam splitter (PBS) 841 for receiving the pulse light beam output from the pulse light source 830 and outputting the pulse light beam in a predetermined polarization direction, (e) a wave plate 842 for receiving the pulse light beam propagating to the device through the PBS 841, optically biasing the light beam by $\lambda/8$ in the polarization direction, and outputting the light beam, (f) a objective lens 843 for focusing the pulse light beam propagating to the device to be measured through the wave plate 842, (g) an E-O probe 844 arranged at the focal point of the objective lens 843, consisting of an electro-optic material with an index profile changed by an electric field, and having a reflection-processed bottom surface, (h) a photodetection unit 850 for receiving the pulse light beam which is emitted from the pulse light source 830, sequentially passes through the E-O probe 844, the wave plate 842, and the objective lens 843, is reflected by the bottom surface of the E-O probe 844, and sequentially passes through the objective lens 843, the wave plate 842, and the PBS 841, and detecting the intensity of the received light beam, (i) a measurement device 860 for receiving and processing a photodetection signal output from the photodetection unit 850 and executing measurement, and (j) a display unit 870 for displaying the measurement result from the measurement device. The photodetection unit 850 comprises ① a photodetector 851 for converting the received light beam to an electrical signal according to the intensity of the light beam, which can respond to a change in light beam of a frequency $\Delta f$ though it cannot respond to a change in light beam of the frequency $f_0$, and ② an amplifier 852 for amplifying the electrical signal output from the photodetector 851 and outputting the signal as the photodetection signal.

The 1st comparative apparatus measures a voltage of the device 890 in the following manner. FIGS. 7A to 7D are views for explaining the operation of the 1st comparative apparatus. FIGS. 7A to 7D are timing charts of signals at the respective positions. FIG. 7E is a graph showing the detection frequency band width.

In the 1st comparative apparatus, the device 890 to be measured is operated by the drive unit 810 at the frequency $f_0$ (=100 MHz). A periodical voltage waveform having a period of $1/f_0$ (=10 ns) is generated at the target measurement portion near the arrangement position of the E-O probe 844.

On the other hand, the pulse source drive unit 820 generates a pulse source drive signal of the frequency $f_0+\Delta f$ ($\Delta f=10$ Hz) synchronized with the input signal of the frequency $f_0$ generated by the drive unit and supplies the signal to the pulse light source 830. As a result, the pulse light source 830 emits a pulse light beam having a period T ($=1/(f_0+\Delta f)$). This pulse light beam is linearly polarized by the PBS 841, optically biased by the wave plate 842, focused by the objective lens 843, and input to the E-O probe 844. Since the index profile of the E-O probe 844 changes due to the voltage signal generated at the target measurement portion, the polarized state of the light beam passing through the E-O probe 844 changes accordingly. The pulse light beam incident on the E-O probe 844 is reflected by the bottom surface of the E-O probe 844 and input to the PBS 841 again through the objective lens 843 and the wave plate 842. Only a component of the polarization direction perpendicular to the polarization direction of the light beam previously output from the PBS 841 is reflected. The light beam input to the PBS 841 again is optically biased by the wave plate 842 twice, as compared to the light beam previously output from the PBS. In addition, since the polarized state is changed through the E-O probe 844, the intensity of the light beam input to the photodetection unit 850 changes in accordance with the polarized state changed through the E-O probe 844. The light beam passing through the wave plate 842 twice is optically biased by $\lambda/4$ in the polarization direction. Therefore, if no voltage is generated at the target measurement portion, the ½ light beam reflected by the E-O probe 844 is input to the photodetection unit 850.

On the other hand, the repetition frequency $f_0+\Delta f$ of the probe light beam (pulse light beam) differs from the fundamental frequency $f_0$ of the voltage signal generated at the target measurement portion. For this reason, the component of the frequency $\Delta f$ ($=f_0+\Delta f-f_0$) is included as a beat signal in the light beam input to the photodetection unit 850. Since the photodetector 851 of the photodetection unit 850 has a low response speed and does not respond to a change in frequency $f_0$, only the beat signal of the frequency $\Delta f$ is detected by the photodetection unit 850.

The measurement device 860 receives the detection signal of the beat signal output from the photodetection unit 850, subtracts a DC component, and displays the measurement result on the display unit 870.

In the 1st comparative apparatus, a relatively low frequency lower than 1 kHz is normally applied as the beat frequency $\Delta f$, i.e., the measurement frequency. However, at such a low frequency, 1/f noise is large, so no high signal-to-noise ratio (S/N ratio) can be obtained.

To solve this problem, an apparatus which reduces 1/f noise by increasing the measurement frequency up to the MHz region to bring the noise during measurement close to shot noise is proposed (Japanese Patent Laid-Open No. 4-158281; to be referred to as the 2nd comparative apparatus hereinafter). FIG. 8 is a block diagram showing the arrangement of the 2nd comparative apparatus. As shown in FIG. 8, the 2nd comparative apparatus comprises (a) a pulse light source 910 for generating a pulse light beam having a period $T_1(=1/f_1)$, (b) a polarizer 921 for receiving the pulse light beam emitted from the pulse light source 910 and selecting and outputting only a polarized light component of the first direction, (c) an optical modulator 922 for receiving the light beam through the polarizer 921 and performing frequency modulation of the light beam at an externally designated modulation frequency $f_M$, (d) a compensating wave plate 923 for receiving and optically biasing the modulated light beam output from the optical modulator 922, (e) an E-O probe 930 for receiving the light beam through the compensating wave plate 923, changing the polarized state of the input light beam in accordance with a voltage signal generated at the target measurement portion of an object 990 to be measured (sample), and outputting the light beam, (f) an analyzer 940 for receiving the light beam output from the E-O probe 930 and selecting and outputting only a polarized component of the second direction, (g) a photodetector 951 for receiving the light beam through the analyzer 940 and outputting a photodetection signal corresponding to the intensity of the received light beam, (h) a narrow-band amplifier 952 for receiving the photodetection signal, selecting, amplifying, and outputting a signal of a frequency approximate to the externally notified modulation frequency $f_M$, (i) a signal averager 953 for performing averaging processing of the signal output from the narrow-band amplifier 952, (j) a display unit 954 for displaying the signal output from the signal averager 953 in time series, (k) an oscillator 960 for notifying the modulation frequency $f_M$ to the optical modulator 922 and the narrow-band amplifier 952, and (l) a signal generator for generating a drive signal of a fundamental frequency $f_2$ for driving the object.

The 2nd comparative apparatus operates as that of 1st comparative apparatus to perform measurement while increasing the measurement frequency close to the modulation frequency $f_M$, by using a polarization modulation method. More specifically, a light beam output from the pulse light source 910 generates a component of a frequency $f_1 + f_M$ through the optical modulator 922. An optical signal having a component of a frequency $|f_1 - f_2| + f_M$, which is modulated at the frequency $f_2$ close to a frequency $f_1$ of a voltage signal generated at the target measurement portion is measured. Since the measurement frequency of the optical signal measured by the photodetector 951 is close to the frequency $f_M$ because $|f_1 - f_2| < f_M$, the measurement frequency is about $f_M$. As compared to the 1st comparative apparatus, even when the beat frequency $\Delta f (= |f_1 - f_2|)$ is set small, measurement is performed while reducing the 1/f noise with respect to the signal. FIG. 9 is a graph for explaining reduction of 1/f noise in measurement by the 2nd comparative apparatus. As shown in FIG. 9, in the 2nd comparative apparatus, an optical signal is measured while reducing 1/f noise almost to shot noise.

The comparative voltage measurement apparatus using an E-O probe has the above arrangement on an assumption that a short pulse source is present as a light source for generating a probe light beam. However, a normal pulse light source can hardly generate a satisfactory short pulse light beam without tails, whereby more accurate measurement is required.

The voltage measurement apparatus according to the present invention can accurately measure a voltage of a sample.

According to the present invention, there is provided a voltage measurement apparatus characterized in that the apparatus is brought close to or into contact with a target measurement portion of an object to detect a voltage of the target measurement portion (sample to be measured), and comprises: (a) a light source for emitting a continuous emission light beam (CW light beam), (b) a polarizer for receiving the light beam emitted from the light source, selecting a component of a first polarization direction, and outputting the component as a probe light beam, (c) a first optical system for guiding the probe light beam output from the polarizer to the target measurement portion, (d) an electro-optic conversion probe (E-O probe) having a member which is arranged at a position in contact with or close to the target measurement portion and consists of an electro-optic material having an electro-optic effect, the member having a reflection-processed bottom surface on the target measurement portion side, (e) a drive unit for driving the sample at a first frequency ($f_0$) and outputting a signal of a fourth frequency ($N \cdot f_0 + \Delta f$) obtained by adding a third frequency ($\Delta f$) lower than the first frequency to a second frequency ($N \cdot f_0$) obtained by multiplying the first frequency by an externally designated first number (N), and a signal of the third frequency, (f) an optical modulator for receiving the light beam reflected by the electro-optic conversion probe, receiving the signal of the fourth frequency output from the drive unit, performing frequency modulation of the input light beam, and outputting the light beam, (g) an optical selection unit for receiving the modulated light beam output from the optical modulator, shifting a phase of the modulated light beam, and selecting and outputting a component of a second polarization direction, (h) a photodetector for receiving the light beam output from the optical selection unit and outputting a photodetection signal corresponding to an intensity of the received light beam, (i) a synchronous detection unit for receiving the photodetection signal output from the photodetector to select a component of the third frequency, receiving the signal of the third frequency output from the drive unit, and detecting the selected component of the photodetection signal in synchronism with the signal of the third frequency output from the drive unit, and (j) a processing unit for notifying the drive unit of the first number, and acquiring and processing synchronous detection signals output from the synchronous detection unit to obtain the voltage of the target measurement portion of the sample.

The drive unit may comprise ① a drive device for outputting a drive signal for driving the sample to be measured at the first frequency and outputting a trigger signal having the first frequency, ② a frequency multiplier for receiving the trigger signal output from the drive device, receiving notification of the first number output from the processing unit, and generating a signal of the second frequency obtained by multiplying the first frequency by the first number, ③ an oscillator for generating the signal of the third frequency, and ④ a mixer for receiving the signal output from the frequency multiplier and the signal output from the oscillator to generate the signal of the fourth frequency corresponding to a sum of a value of the second frequency and a value of the third frequency.

The optical modulator is preferably an electro-optic optical modulator using the electro-optic effect. An electroabsorption type optical modulator or an acoustooptic optical modulator may be used.

The selection unit may comprise ① a wave plate for receiving the modulated light beam output from the optical modulator, adjusting the phase, and outputting the light beam, and ② an analyzer for receiving the light beam through the wave plate and selecting and outputting the component of the second polarization direction.

As the photodetector, a two-dimensional photodetector can be preferably used.

The synchronous detection unit may comprise ① a filter for receiving the photodetection signal output from the photodetector and selecting the component of the third frequency, and ② a synchronous detector for receiving the signal output from the filter and the signal of the third frequency output from the drive unit and detecting the signal output from the filter in synchronism with the signal of the third frequency output from the drive unit.

The synchronous detection signals may be ① an amplitude detection signal representing an amplitude of the component of the third frequency of the photodetection signal output from the photodetector, and ② a phase detection signal representing a phase difference between the component of the third frequency of the photodetection signal output from the photodetector and the signal of the third frequency output from the drive unit. The processing unit may notify the drive unit of the first number while sequentially changing the first number by one, acquire the amplitude detection signal and the phase detection signal at the time of notification of the first number every time the first number is notified, and calculate a time waveform of a voltage signal generated at the target measurement portion of the sample by the drive signal in accordance with Fourier transform upon completion of acquisition.

In the voltage measurement apparatus of the present invention, the processing unit notifies the drive unit of the designated number N (=1). The drive unit supplies a drive signal of the frequency $f_0$ to the sample (e.g., an IC chip or an liquid crystal display panel) and supplies a modulation signal of a frequency $N \cdot f_0 + \Delta f$ to the optical modulator. The sum frequency $N \cdot f_0 + \Delta f$ will be described below, though a difference frequency $N \cdot f_0 - \Delta f$ may also be used.

In this state, a continuous emission light beam is emitted from the light source and incident on the E-O probe sequentially through the polarizer and the first optical system. A periodical voltage waveform is generated at the target measurement portion near the arrangement position of the E-O probe at the fundamental period $1/f_0$. When the light passes through the electro-optic member of the E-O probe, the polarization state is influenced. As a result, the polarization state of the light beam output from the E-O probe is modulated at the frequency $M \cdot f_0$ (M=1, 2, ...)

The optical signal whose polarization state is modulated is input to the optical modulator and modulated again. Thereafter, the polarization direction is selected by the optical selection unit, and the optical signal is input to the photodetector. Therefore, the photodetection signal output from the photodetector includes the component of a frequency $L \cdot f_0 + \Delta f$ (L=|N−M|=0, 1, ...) This photodetection signal is input to the synchronous detection unit, and the component of the frequency $\Delta f$ is heterodyne-detected. The synchronous detection signal is obtained in accordance with the component of the frequency $M \cdot f_0$ (=$f_0$; M=N) of a voltage signal generated at the target measurement portion. The processing unit acquires the heterodyne-detected synchronous detection signal and stores the signal as data corresponding to N=1.

The processing unit notifies the drive unit of the designated number N (=2), acquires the synchronous detection signal, and stores the signal as data corresponding to N=2, as in the case of N=1.

While the designated number is sequentially increased, the synchronous detection signal is acquired and stored as data corresponding to each designated number N. Acquisition and storing are continued until the designated number N for allowing the value of the synchronous detection signal to be regarded as almost zero is reached.

Upon completion of acquisition and storing, the arithmetic unit reproduces the waveform of the voltage signal generated at the target measurement portion by calculation of Fourier transform on the basis of the stored data and displays the waveform.

The heterodyne detection method of the apparatus of the present invention substantially differs from that of the 1st comparative apparatus. More specifically, in the heterodyne detection method of the 1st comparative apparatus, the detection band width must be set in a wide range up to $n \cdot \Delta f$. However, in the apparatus of the present invention, only the component of $\Delta f$ is measured so that a very narrow band width can be set.

In the apparatus of the present invention, to increase the frequency bandwidth for voltage waveform measurement, the upper limit frequency of the modulation signal input to the optical modulator must be raised to increase the designated number N and enable measurement of a term of higher order. However, when an electro-optic optical modulator using an electro-optic material is employed, measurement in a band of 10 GHz or more is enabled. If the frequency characteristic of the optical modulator is not flat, a correction value is obtained by measuring a standard sample in advance, and the amplitude of a modulation signal to be applied to the optical modulator is adjusted.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIGS. 2A to 2H are charts for explaining the operation of the voltage measurement apparatus according to the first embodiment of the present invention.

DESCRIPTION OF THE PREFERRED EMBODIMENTS

Figure 1:
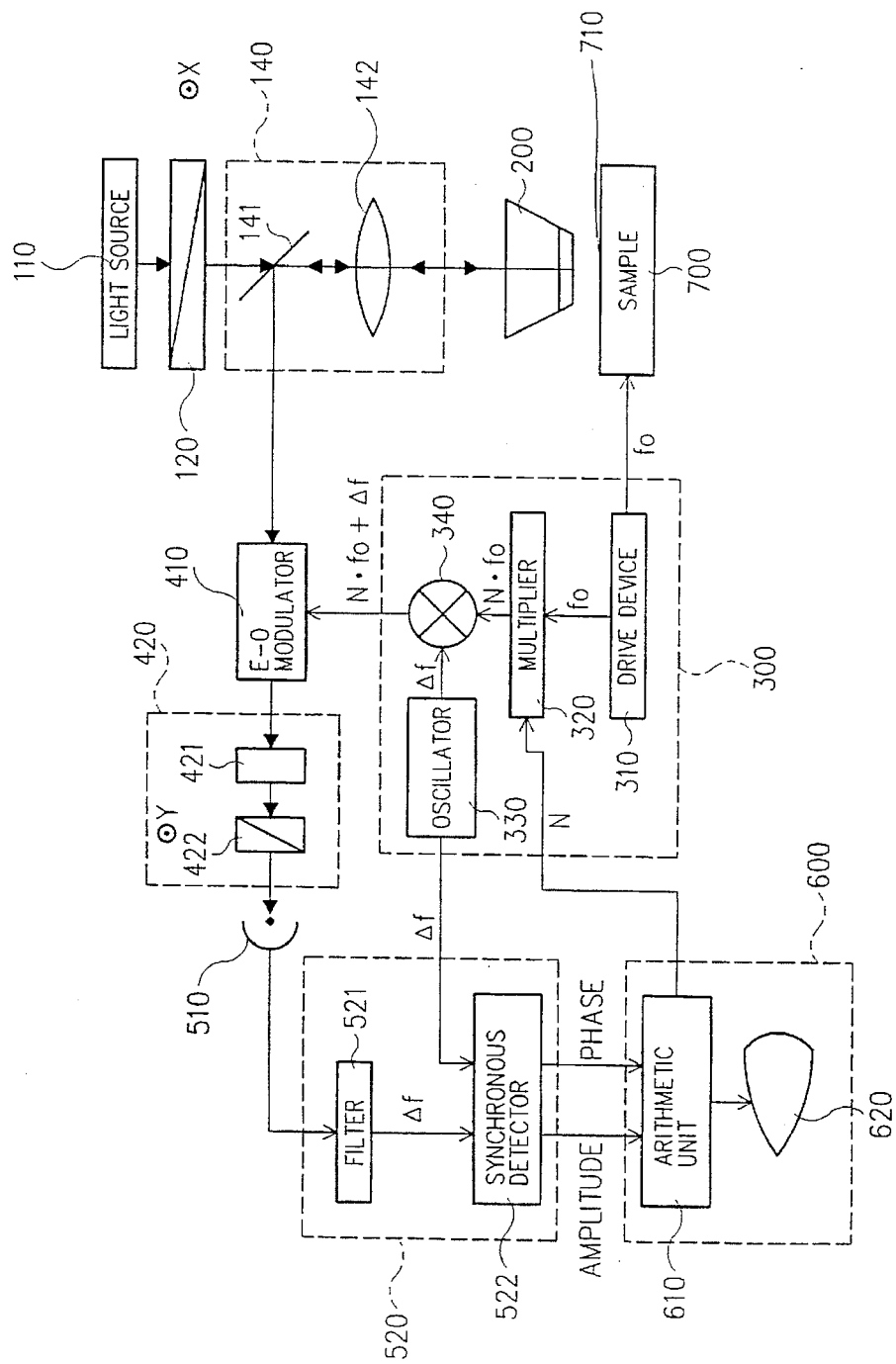
FIG. 1 is a block diagram showing the arrangement of a voltage measurement apparatus according to the first embodiment of the present invention.

A voltage measurement apparatus according to an embodiment of the present invention will be described below with reference to the accompanying drawings. The same reference numerals denote the same elements throughout the drawings, and a detailed description thereof will be omitted.

(First Embodiment)

FIG. 1 is a block diagram showing the arrangement of a voltage measurement apparatus according to the first embodiment of the present invention. As shown in FIG. 1, the apparatus of this embodiment comprises (a) a light source 110 for generating a continuous emission light beam, (b) a polarizer 120 for receiving the light beam output from the light source 110, selecting a component of the first polarization direction (X direction in FIG. 1), and outputting the component as a probe light beam, (c) an optical system 140 for focusing the probe light beam output from the polarizer 120, (d) an E-O probe 200 which is arranged at a position almost matching the focus position of the optical system 140, and has a member consisting of an electro-optic material having an electro-optic effect and a reflection-processed bottom surface on a target measurement portion 710 side, (e) a drive unit 300 for driving a sample 700 to be measured (e.g., a device such as an IC chip or a liquid crystal display panel) at a frequency $f_0$ (=100 MHz) and outputting a signal of a frequency $N \cdot f_0 + \Delta f$ obtained by adding a frequency $\Delta f$ lower than the frequency $f_0$ to a frequency $N \cdot f_0$ obtained by multiplying an externally designated number N (=1, 2, . . . ) by the frequency $f_0$, and a signal of the frequency $\Delta f$, (f) an electro-optic optical modulator 410 for receiving the light beam reflected by the E-O probe 200, receiving the signal of the frequency $N \cdot f_0 + \Delta f$ output from the drive unit 300, performing frequency modulation of the phase of the input light beam, and outputting the light beam, (g) an optical selection unit 420 for receiving the modulated light beam output from the electro-optic optical modulator 410, shifting the phase of the modulated light beam, and selecting and outputting a component of the second polarization direction (Y direction in FIG. 1), (h) a photodetector 510 for receiving the light beam output from the electro-optic optical modulator 410 and outputting a photodetection signal corresponding to the intensity of the received light beam, (i) a synchronous detection unit 520 for receiving the photodetection signal output from the photodetector 510, selecting the component of the frequency $\Delta f$, at the same time receiving the signal of the frequency $\Delta f$ output from the drive unit 300, synchronously detecting the selected photodetection signal in synchronism with the signal of the frequency $\Delta f$ output from the drive unit 300, and outputting ① an amplitude detection signal representing the amplitude of the component of the frequency $\Delta f$ of the photodetection signal output from the photodetector 510, and ② a phase detection signal representing the phase difference between the signal of the component of the frequency $\Delta f$ of the photodetection signal output from the photodetector 510 and the signal of the frequency $\Delta f$ output from the drive unit, and (j) a processing unit 600 for notifying the drive unit 300 of a designated number N, acquiring and processing the amplitude detection signal and the phase detection signal output from the synchronous detection unit 520 to obtain the voltage signal waveform of the target measurement portion 710.

The optical system 140 has ① a half mirror 141 for transmitting and outputting part of the probe light beam output from the polarizer 120 and reflecting and outputting part of the light beam reflected by the E-O probe 200, which is input in a direction opposite to the transmission output direction of the probe light beam, toward the electro-optic optical modulator 410, and ② a focusing lens 142 for focusing the probe light beam transmitted through the half mirror 141.

The drive unit 300 has ① a drive device 310 for outputting a drive signal for driving the sample 700 at the frequency $f_0$, and outputting a trigger signal having the frequency $f_0$, ② a frequency multiplier 320 for receiving the trigger signal output from the drive device 310, and receiving the notification of the designated number N output from the processing unit 600 to generate a signal of the frequency $N \cdot f_0$ obtained by multiplying the designated number N by the frequency $f_0$, ③ an oscillator 330 for generating the signal of a frequency $\Delta f_0$, and ④ a mixer 340 for receiving the signal output from the frequency multiplier 320 and the signal output from the oscillator 330, and generating a signal of a frequency $N \cdot f_0 + \Delta f$ corresponding to the sum of the frequency $N \cdot f_0$ and the frequency $\Delta f$.

The selection unit 420 has ① a wave plate 421 for receiving the modulated light beam output from the electro-optic optical modulator 410, adjusting the phase, and outputting the light beam, and ② an analyzer 422 for receiving the light beam through the wave plate 421 and selecting and outputting the polarized light component of the Y direction.

The synchronous detection unit 520 has ① a filter 521 for receiving the photodetection signal output from the photodetector 510 and selecting the component of the frequency $\Delta f$, and ② a synchronous detector 522 for receiving the signal output from the filter 521 and the signal of the frequency $\Delta f$ output from the drive unit 300, detecting the signal output from the filter 521 in synchronism with the signal of the frequency $\Delta f$ output from the drive unit 300, and outputting i) an amplitude detection signal representing the amplitude of the component of the frequency $\Delta f$ of the photodetection signal output from the photodetector 510, and ii) a phase detection signal representing the phase difference between the signal of the component of the frequency $\Delta f$ of the photodetection signal output from the photodetector 510 and the signal of the frequency $\Delta f$ output from the drive unit. As the synchronous detector 522, a narrow band width detector such as a network analyzer, a spectrum analyzer, and a lock-in amplifier can be preferably employed.

The apparatus of this embodiment measures a voltage signal waveform at the target measurement position 710 of the sample 700 in the following manner. FIGS. 2A to 2H are charts showing the operation of the apparatus of this embodiment.

An arithmetic unit 610 of the processing unit 600 notifies the drive unit 300 of the designated number N (=1). The drive unit 300 supplies a drive signal of the frequency $f_0$ to the sample 700 and supplies a modulation signal of the frequency $N \cdot f_0 + \Delta f$ to the electro-optic optical modulator 410.

In this state, a continuous light beam is emitted from the light source 110 and incident on the E-O probe 200 through the polarizer 120 and the first optical system 140. A periodical voltage waveform is generated at the target measurement portion near the arrangement position of the E-O probe 200 at a fundamental period $1/f_0$. The polarization state is influenced by the light beam passing through the electro-optic member of the E-O probe 200. As a result, the polarization state of the light beam reflected and output from the E-O probe 200 is modulated at a frequency $M \cdot f_0$ (M=1, 2, . . . )

Figure 3:
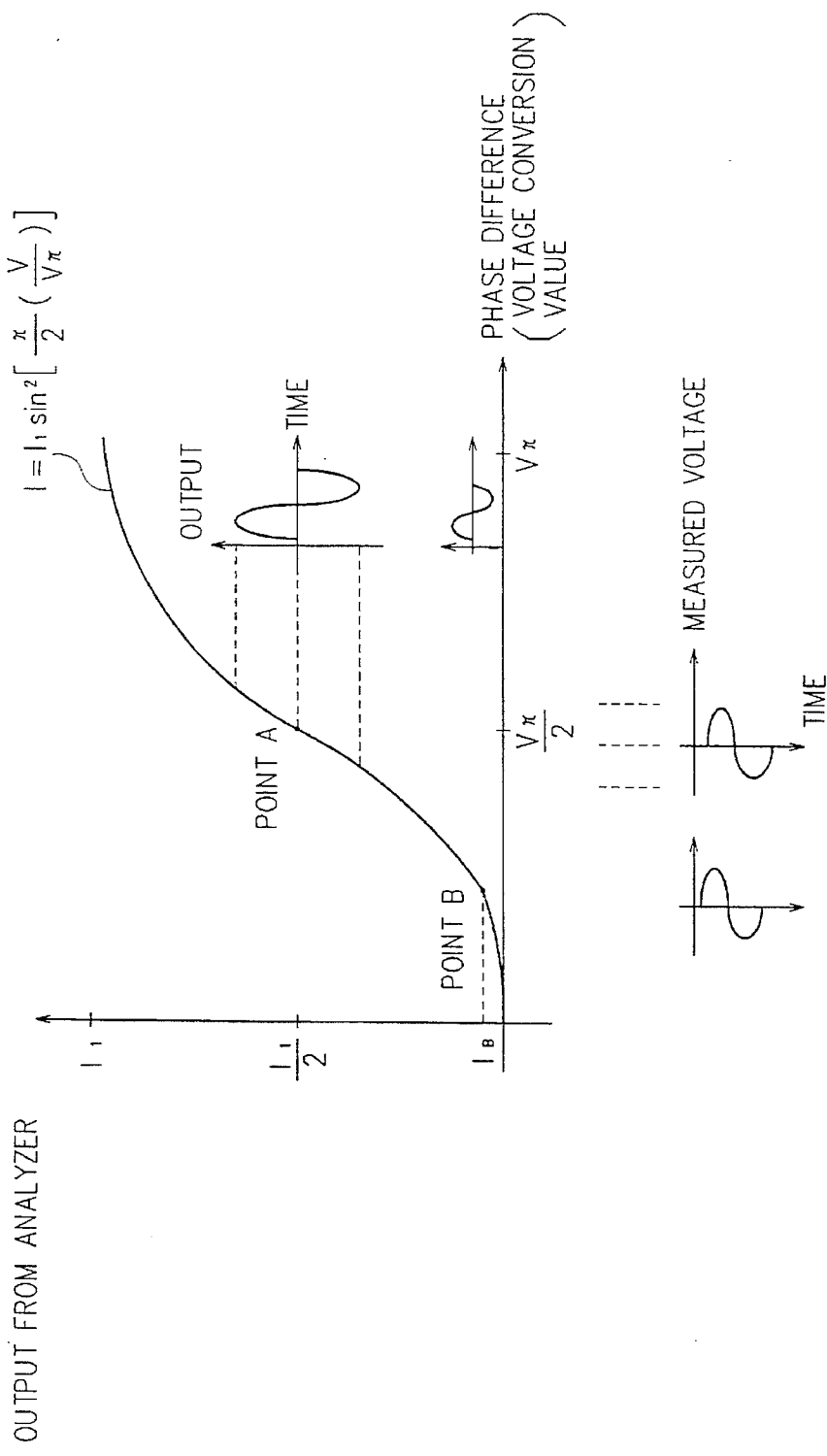
FIG. 3 is a graph for explaining an optical bias.

The optical signal whose polarization state is modulated is input to the electro-optic optical modulator 410, modulated, and optically biased by the wave plate 421 of the optical selection unit 420. FIG. 3 is a graph for explaining the optical bias applied by the wave plate. In a voltage measurement apparatus using a normal E-O probe, a ¼ wave plate is used to set the optical bias to a point A in FIG. 3. With this setting, the maximum output change can be obtained with respect to the output from the analyzer 422. In this case, however, a DC output as large as $I_1/2$ is also output together with the modulation output, and shot noise is generated due to this DC output. A theoretical lower limit $I_{noise}$ of such shot noise is represented as follows:

$$I_{noise}=(2 \cdot q I_{dc})^{1/2} \quad (1)$$

for $q=1.6 \times 10^{-19}$ coulomb $$I_{dc}=I_1/2$$

On the other hand, when the wave plate is changed to set the optical bias to a point B, shot noise becomes small, though the output change also becomes small, and the S/N ratio may be increased. In the apparatus of this embodiment, the wave plate 421 may be selected to optimize the optical bias, thereby obtaining a satisfactory S/N ratio.

The light beam optically biased by the wave plate 421 is input to the photodetector 510 while the polarization direction is selected by the analyzer 422. Therefore, the photodetection signal output from the photodetector 510 includes a component of a frequency $L \cdot f_0 + \Delta f$ ($L=|N-M|=0, 1, \ldots$). This photodetection signal is input to the synchronous detection unit 520, and the component of the frequency $\Delta f$ is heterodyne-detected. The synchronous detection signal is obtained in accordance with the component of the frequency $M \cdot f_0$ ($=f_0$; M=N) of the voltage signal generated at the target measurement portion. The arithmetic unit 610 of the processing unit 600 acquires the heterodyne-detected synchronous detection signal and stores the signal as data corresponding to N=1.

The processing unit 600 notifies the drive unit 300 of the designated number N (=2), acquires the synchronous detection signal, and stores the signal as data corresponding to N=2, as in the case of N=1.

While the designated number is sequentially increased, the synchronous detection signal is acquired and stored as data corresponding to each designated number N. Acquisition and storing are continued until the designated number N for allowing the value of the synchronous detection signal to be regarded as almost zero is reached, or until the limit frequency for the modulation capability of the electro-optic optical modulator is reached.

Upon completion of acquisition and storing, the arithmetic unit 610 of the processing unit 600 reproduces the waveform of the voltage signal generated at the target measurement portion by calculation of Fourier transform on the basis of the stored data and displays the reproduction result on a display unit 620.

(Second Embodiment)

Figure 4:
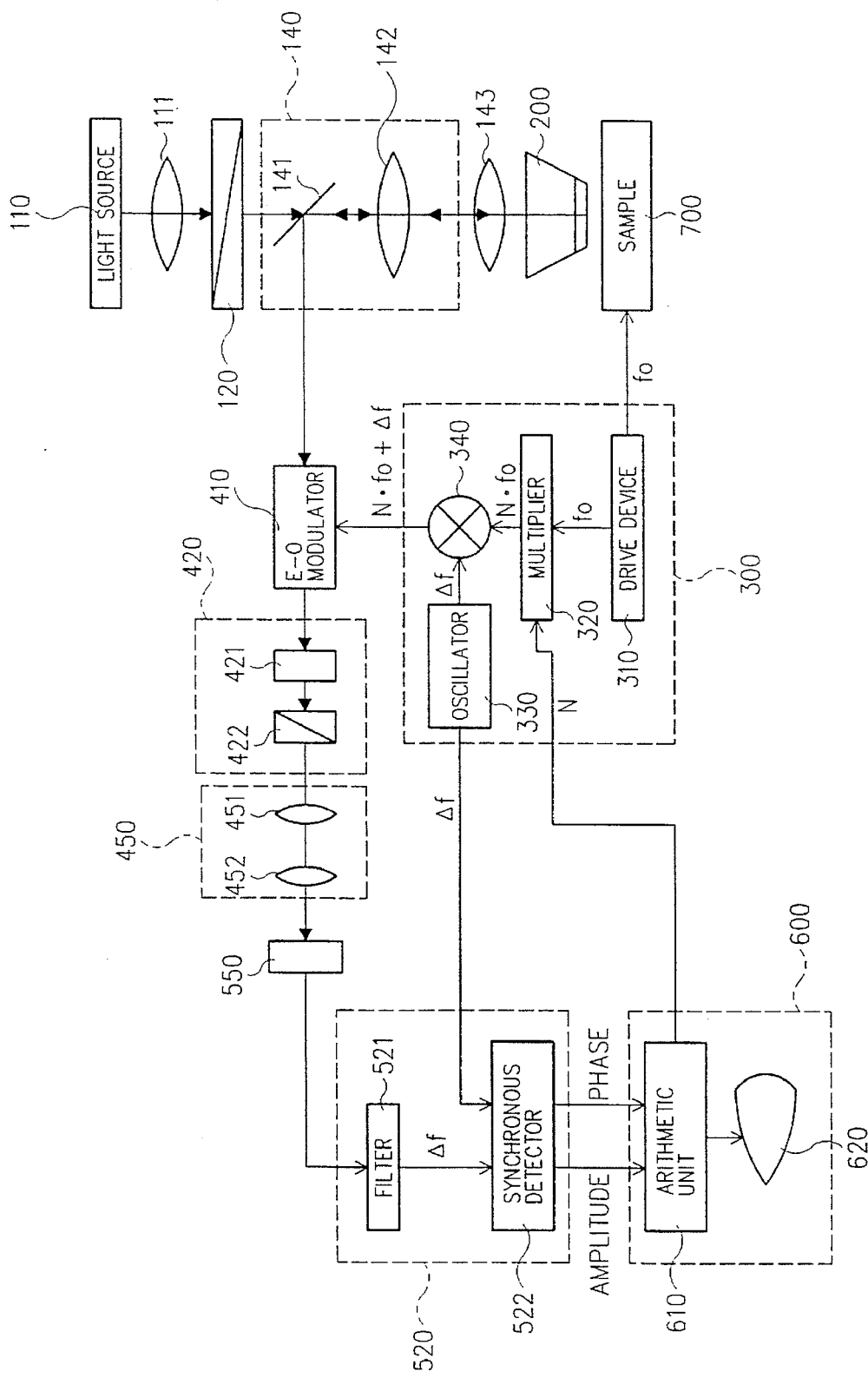
FIG. 4 is a block diagram showing the arrangement of a voltage measurement apparatus according to the second embodiment of the present invention.

FIG. 4 is a block diagram showing the arrangement of a voltage measurement apparatus according to the second embodiment of the present invention. The apparatus of this embodiment measures the two-dimensional voltage distribution of a target measurement portion. As shown in FIG. 4, the apparatus of this embodiment differs from that of the first embodiment in that a collimator lens 111 and a collimator lens 143 are arranged between a light source 110 and a polarizer 120 and between a focusing lens 142 and an E-O probe 200, respectively, to form an imaging optical system, an imaging system 450 consisting of a lens 451 and a lens 452 is arranged after an analyzer 422, and a two-dimensional photodetector 550 is employed as a photodetector. As a processing unit, a processing unit 650 having an arithmetic unit 651 is employed.

As the two-dimensional photodetector 550, a high-speed read CCD image sensor capable of performing a high-speed read operation is used. A general two-dimensional photodetector such as a photodiode array, an imaging tube, a normal CCD image sensor, or a linear array sensor can also be used.

In the apparatus of this embodiment, a light beam emitted from the light source 110 is collimated and incident on the E-O probe 200, and reflected. The two-dimensional image of the reflecting portion is formed, input to the two-dimensional photodetector 550, and converted to a two-dimensional photodetection signal. As in the first embodiment, the processing unit 650 acquires and stores a synchronous detection signal at each measurement point, and reproduces the voltage waveform at each measurement point upon completion of acquisition and storing.

In the apparatus of this embodiment, an electro-optic optical modulator 410 must perform modulation throughout an area larger than that in the first embodiment. However, this apparatus can be easily realized because only the uniformity is required.

Figure 5:
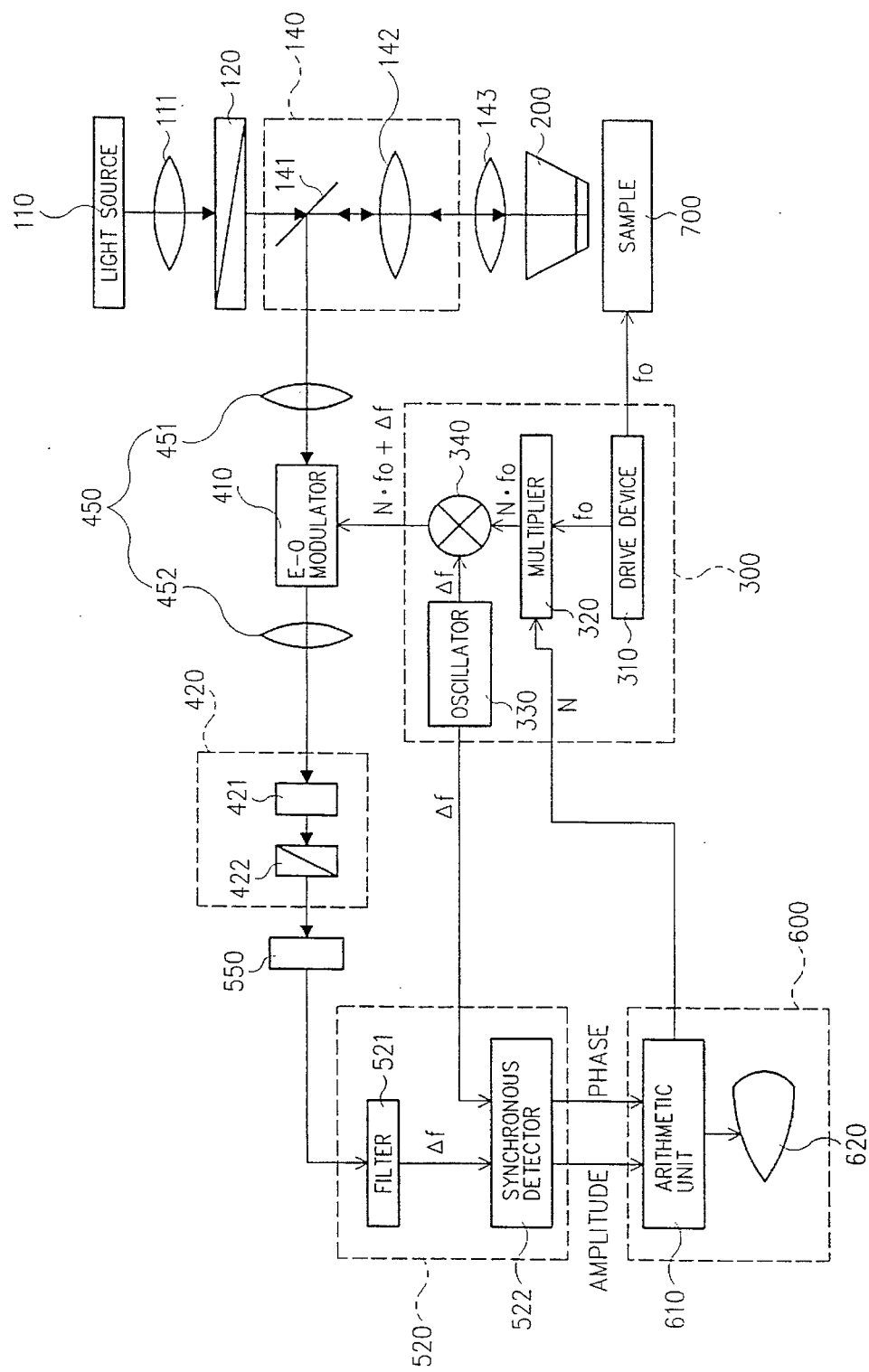
FIG. 5 is a block diagram showing the arrangement of a modification of the voltage measurement apparatus according to the second embodiment of the present invention.
Figure 6:
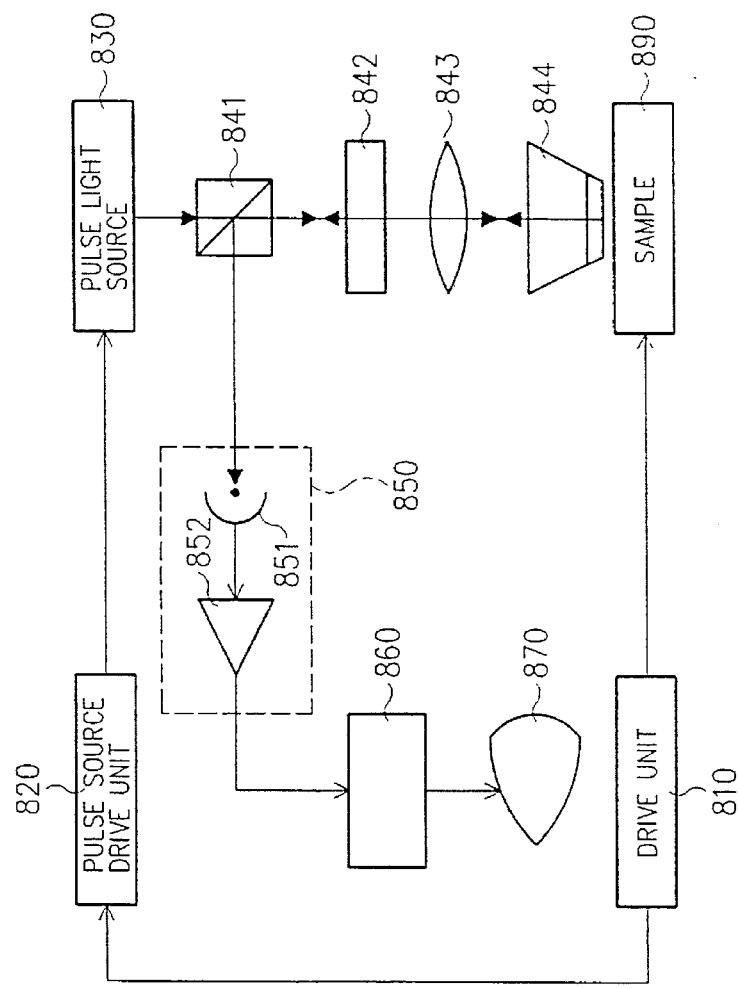
FIG. 6 is a block diagram showing the arrangement of the 1st comparative apparatus.
Figure 7A:
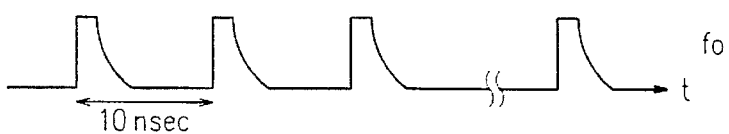
FIGS. 7A to 7E are views for explaining the operation of the 1st comparative apparatus.
Figure 7B:
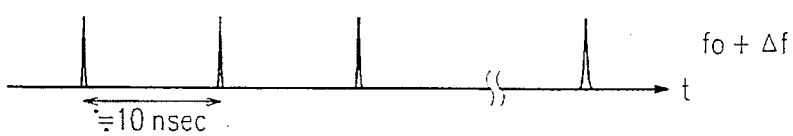
Figure 7C:
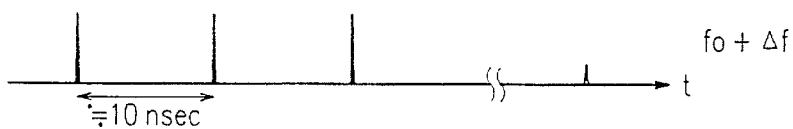
Figure 7D:
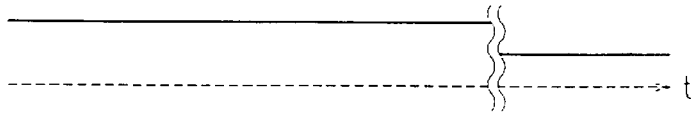
Figure 7E:
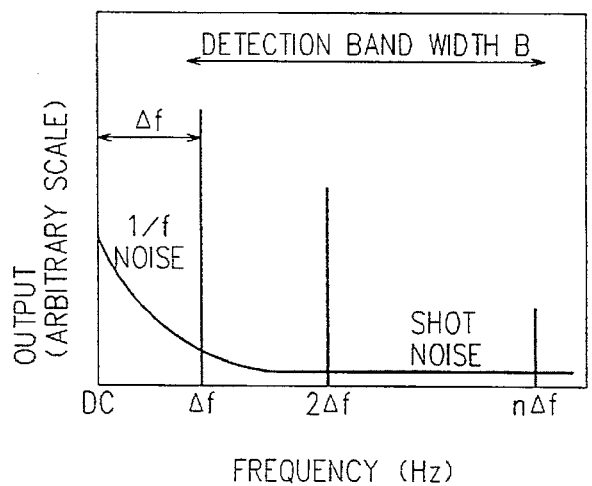
Figure 8:
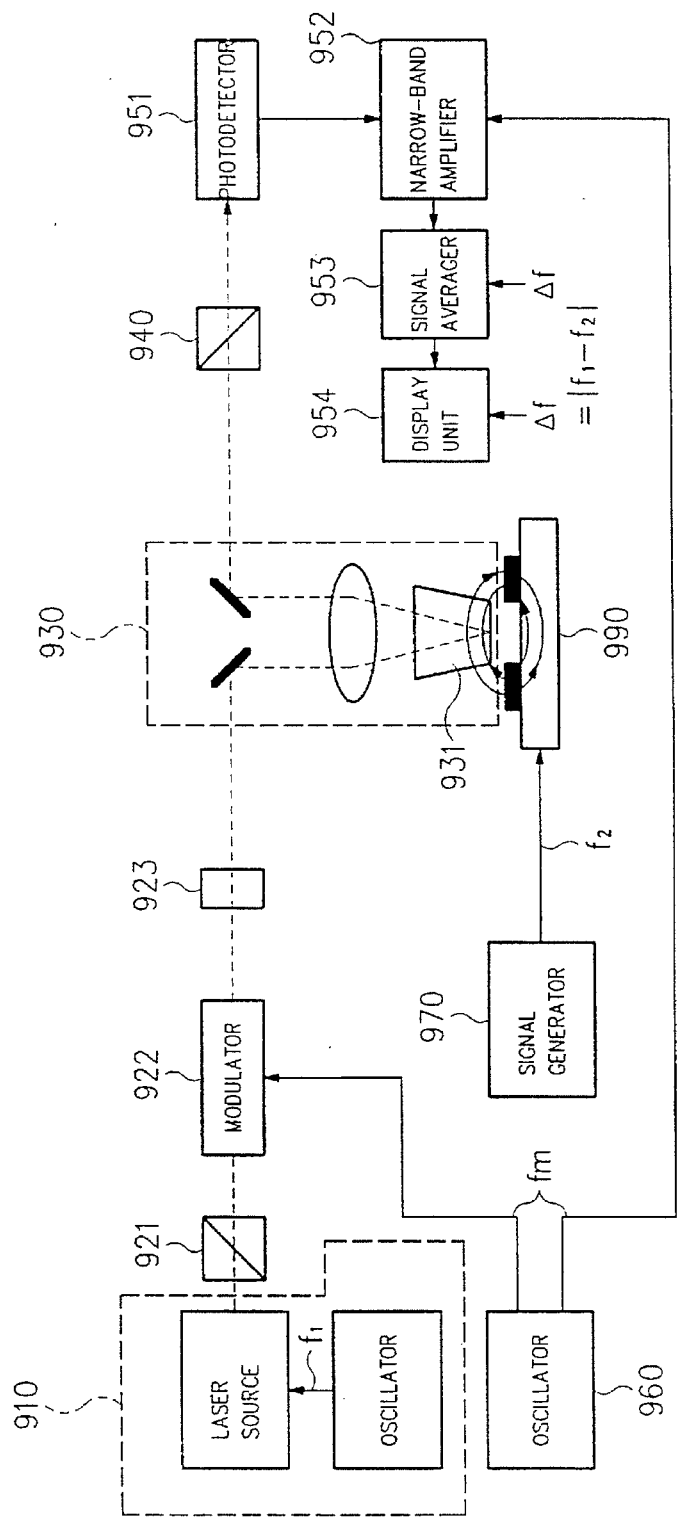
FIG. 8 is a block diagram showing the arrangement of the 2nd comparative apparatus.
Figure 9:
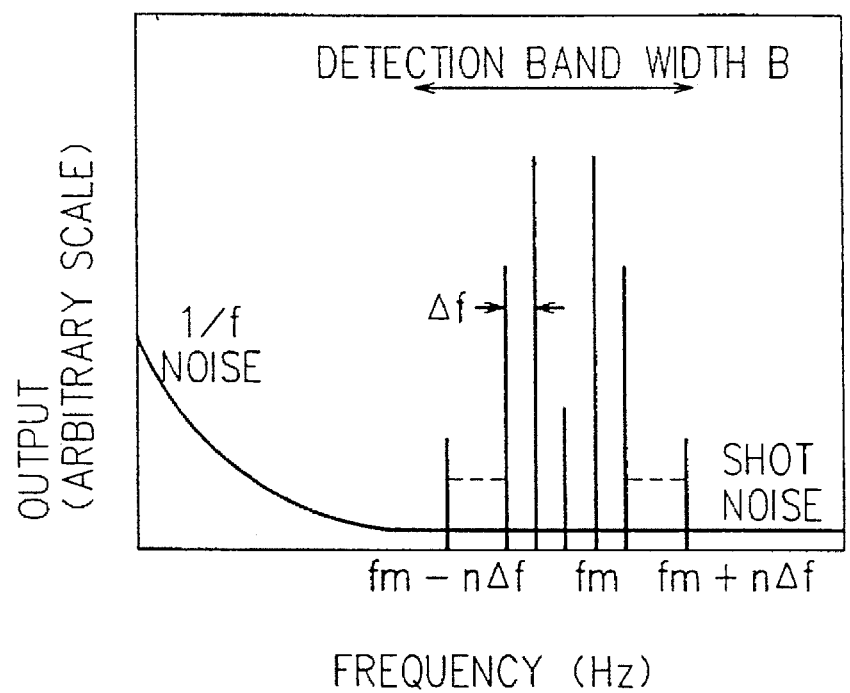
FIG. 9 is a graph for explaining the operation of the 2nd comparative apparatus.

When the apparatus arrangement is modified as shown in FIG. 5 in which the lens 451 and the lens 452 are arranged on both the sides of the electro-optic optical modulator 410, the modulation area can be reduced, as in the first embodiment.

As has been described above in detail, according to the voltage measurement apparatus of the present invention, a continuous emission light beam is employed, and after the continuous light beam is influenced by the voltage generated in the sample, modulation and heterodyne detection are performed. Therefore, an accurate voltage measurement apparatus which has a wide frequency band width and needs no short-pulse light source can be realized.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 019252/1995 (7-019252) filed on Feb. 7, 1995, is hereby incorporated by reference.

What is claimed is:

1. A voltage measurement apparatus for detecting a voltage of a sample, comprising:

a light source for emitting a continuous emission light beam;

a polarizer for receiving the light beam emitted from said light source, selecting a component of a first polarization direction, and outputting the component as a probe light beam;

a first optical system for guiding the probe light beam output from said polarizer toward the sample;

an electro-optic conversion probe arranged in a path way of the probe light beam from said first optical system, said probe having a member to be arranged near the sample, said member including an electro-optic material;

a drive unit for driving the sample at frequency $f_0$ and outputting signals of frequencies f and $\Delta f$, wherein $f=N \cdot f_0+\Delta f$, where N is an integer and $\Delta f$ is a frequency smaller than the frequency $f_0$, an optical modulator for receiving the light beam and performing frequency modulation of the light beam input thereinto based on the signal of the frequency f which is supplied from said drive unit;

an optical selection unit for receiving the modulated light beam output from said optical modulator, shifting a phase of the modulated light beam, and selecting and outputting a component of a second polarization direction;

a photodetector for receiving the light beam output from said optical selection unit and outputting a photodetection signal corresponding to an intensity of the received light beam;

a synchronous detection unit for receiving the photodetection signal output from said photodetector to select a component of frequency $\Delta f$ in synchronism with the signal of the frequency $\Delta f$ output from said drive unit; and a processing unit for informing said drive unit of the integer N, and processing synchronous detection signal output from said synchronous detection unit to obtain the voltage of the sample.

2. A voltage measurement apparatus according to claim 1, wherein said drive unit comprises:

a drive device for outputting a drive signal for driving the sample at the frequency $f_0$ and outputting a trigger signal having the frequency $f_0$, a frequency multiplier for receiving the trigger signal having the frequency $f_0$ output from said drive device, receiving notification of the integer N output from said processing unit, and generating a signal of the frequency $N \cdot f_0$ by multiplying the frequency $f_0$ by the integer N, an oscillator for generating the signal of the frequency $\Delta f$, and a mixer for receiving the signal output from said frequency multiplier and the signal output from said oscillator to generate the signal of the frequency f.

3. A voltage measurement apparatus according to claim 1, wherein said optical modulator is an electro-optic modulator using the electro-optic effect.

4. A voltage measurement apparatus according to claim 1, wherein said selection unit comprises:

a wave plate for receiving the modulated light beam output from said optical modulator, adjusting the phase, and outputting the light beam, and an analyzer for receiving the light beam through said wave plate and selecting and outputting the component of the second polarization direction.

5. A voltage measurement apparatus according to claim 1, wherein said photodetector is a two-dimensional photodetector.

6. A voltage measurement apparatus according to claim 1, wherein said synchronous detection unit comprises:

a filter for receiving the photodetection signal output from said photodetector and selecting the component of the frequency $\Delta f$, and a synchronous detector for receiving the signal output from said filter and the signal of the frequency $\Delta f$ output from said drive unit and detecting the signal output from said filter in synchronism with the signal of the frequency $\Delta f$ output from said drive unit.

7. A voltage measurement apparatus according to claim 1, wherein the synchronous detection signals are an amplitude detection signal representing an amplitude of the component of the frequency $\Delta f$ of the photodetection signal output from said photodetector, and a phase detection signal representing a phase difference between the amplitude detection signal representing the component of the frequency $\Delta f$ of the photodetection signal output from said photodetector and the signal of the frequency $\Delta f$ output from said drive unit, and said processing unit informs said drive unit of the integer N while sequentially changing the integer N by one, acquires the amplitude detection signal and the phase detection signal at the time of notification of the integer N every time the integer N is notified, and calculates a time waveform of a voltage signal generated at said sample by the drive signal in accordance with Fourier transform upon completion of acquisition.

8. A voltage measurement apparatus for detecting a voltage of a sample, comprising:

a light source for emitting a continuous emission light beam;

a polarizer for receiving the light beam emitted from said light source, selecting a component of a first polarization direction, and outputting the component as a probe light beam;

a first optical system for guiding the probe light beam output from said polarizer toward the sample;

an electro-optic conversion probe arranged in a path way of the probe light beam from said first optical system, said probe having a member to be arranged near the sample, said member including an electro-optic material;

a drive unit for driving the sample at frequency $f_0$ and outputting signals of frequencies f and $\Delta f$, wherein $f=N \cdot f_0-\Delta f$, where N is an integer and $\Delta f$ is a frequency smaller than the frequency $f_0$, an optical modulator for receiving the light beam reflected by said electro-optic conversion probe and performing frequency modulation of the light beam input thereinto based on the signal of the frequency f which is supplied from said drive unit;

an optical selection unit for receiving the modulated light beam output from said optical modulator, shifting a phase of the modulated light beam, and selecting and outputting a component of a second polarization direction;

a photodetector for receiving the light beam output from said optical selection unit and outputting a photodetection signal corresponding to an intensity of the received light beam;

a synchronous detection unit for receiving the photodetection signal output from said photodetector to select a component of frequency $\Delta f$ in synchronism with the signal of the frequency $\Delta f$ output from said drive unit; and a processing unit for informing said drive unit of the integer N, and processing synchronous detection signal output from said synchronous detection unit to obtain the voltage of the sample.

\* \* \* \* \*

UNITED STATES PATENT AND TRADEMARK OFFICE
CERTIFICATE OF CORRECTION

PATENT NO. : 5,625,296
DATED : April 29, 1997
INVENTOR(S) : TAKAHASHI et al

It is certified that error appears in the above-identified patent and that said Letters Patent is hereby corrected as shown below:

Title page;

Please change:

"[73] Assignee: Hamamatsu Photonics K.K., . . . Japan"

TO

— [73] Assignee: Hamamatsu Photonics K.K., . . . Japan and Takeshi Hamiya, Tokyo, Japan. —

Signed and Sealed this

Sixteenth Day of December, 1997

Attest:

BRUCE LEHMAN

*Attesting Officer*   *Commissioner of Patents and Trademarks*